United States Patent [19]

Klein

[11] Patent Number: 5,394,403
[45] Date of Patent: Feb. 28, 1995

[54] FULLY TESTABLE CHIP HAVING SELF-TIMED MEMORY ARRAYS

[75] Inventor: Michael F. Klein, Palo Alto, Calif.

[73] Assignee: Sun Microsystems, Inc., Mountain View, Calif.

[21] Appl. No.: 897,801

[22] Filed: Jun. 12, 1992

[51] Int. Cl.⁶ .............................................. G11C 29/00
[52] U.S. Cl. ................................... 371/21.1; 371/22.3
[58] Field of Search ................. 371/21.1, 22.3, 3, 15.1, 371/18, 22.4, 22.6, 21.2, 10.3, 16.5, 25.1, 29.1; 395/400, 425; 354/224.1, 222.81

[56] References Cited

U.S. PATENT DOCUMENTS

| | | | |
|---|---|---|---|
| 3,970,993 | 7/1976 | Finnila | 395/800 |
| 4,355,377 | 10/1982 | Sud et al. | 365/203 |
| 4,701,921 | 10/1987 | Powell et al. | 371/25.1 |
| 4,833,676 | 5/1989 | Koo | 371/15.1 |
| 5,029,133 | 7/1991 | La Fetra et al. | 371/3 |
| 5,031,141 | 7/1991 | Guddat et al. | 365/49 |
| 5,124,589 | 6/1992 | Shiomi et al. | 371/21.1 |

Primary Examiner—Robert W. Beausoliel, Jr.
Assistant Examiner—Dieu-Minh Le
Attorney, Agent, or Firm—Blakely Sokoloff Taylor & Zafman

[57] ABSTRACT

A method and apparatus is provided for testing self timed memory arrays which does not affect the state of cells within the arrays not being tested. Each memory array has a plurality of control, address and data registers which are coupled to the respective control, address and data lines into the memory array. A timing generator circuit receives an external clock pulse and provides the self-timed clock pulses to the memory array. During the shift mode, the control, address and data registers are chained together such that data for testing can be scanned serially into the registers. In order to prevent unplanned array modification operations from occurring during the shift mode because a bit shifted into the write-enable or clear register at the time a clock pulse derived from the timing circuitry is generated, a logic means is provided to disable all clock pulses during the shift mode. A separate shift clock pulse is provided during shift mode to shift the test information into the control, address and data registers. Once the information is shifted in, a separate test clock pulse is issued to cause the operation indicated by the data in the address, control and data registers to be performed. Thus, the operation identified by the control address and data registers is performed without affecting the state of the control registers of adjacent memory arrays and without affecting the state of other memory cells and components on the chip while maintaining the same temporal state of the chip.

17 Claims, 3 Drawing Sheets

FULLY TESTABLE CHIP HAVING SELF-TIMED MEMORY ARRAYS

BACKGROUND OF THE INVENTION

(1) Field of the Invention

The present invention relates to the testing and debugging of electrical components. Specifically the present invention relates to the testing of memory cell arrays in the context of testing systems built with these arrays.

(2) Art Background

Once an electrical device or chip is built, it is necessary to test it to ensure that the chip operates correctly. Subsequent testing is often desired after the chip has been connected to other chips and/or mounted on a circuit board and placed within a system in order to ensure the correct operation of the system. Debugging may be required if the chip does not operate correctly. Debugging may also be required after the system has been operational for some time if subsequent errors arise during the operation of the system. Examples of desirable debugging aids include the ability to stop the operation of the system at any time, examine its entire "state"(the set of values held in memory elements), without affecting that state, and resume operation. The ability to modify the system's state and resume operation with the modified state is also highly desirable.

As the amount of logic and/or memory increases per chip, the ability to test and debug the chips becomes more difficult. In addition, as chip integration increases, state within the chip which needs to be accessible for debugging or testing purposes is not available directly at the pins of the chip package, while the higher integration level and complexity of the chip makes observation and control of the chip's internal state more and more important.

In addition to growing logic complexity, memory arrays are also being incorporated into chip designs. Memory elements are typically used either individually or in small groups (respectively, flipflops or registers), or in larger arrays. Large memory arrays have certain advantages when implemented as "self-timed" circuits, including lower power dissipation and area usage for a given level of performance, and simplified interconnection and verification with the rest of the logic on the chip. However, a traditional implementation of self-timed memory arrays reduces the amount of control over and observability of the contents of the memory arrays in the context of testing and debug. Thus a method whereby control and observability of the memory arrays to enable the debug capabilities described above is required.

The JTAG specification outlines a standard test interface, or port, and a JTAG port controller specification. A chip which complies with the JTAG specification is provided with at least four pins that receive a scan input, drive a scan output, and control the "mode"(-whether and how the chip responds to input at its JTAG pins), and a JTAG clock to provide timing signals.

In the implementation described herein, for example, in one JTAG state ("shift-DR" state), the "scannable" state of the chip is both readable and writable as a single shift register connected from the JTAG scan input pin to the JTAG scan output pin. In this JTAG state, chip state information is serially input to the component to be tested through the scan input pin, or serially read at the scan output pin, or a combination of both. Once the state information is input, the component can be clocked in its normal (non-JTAG) mode to perform the debugging operation scanned in serially through the scan input pin. For additional information regarding the JTAG specification, see *IEEE Standard Test Access Port and Boundary-Scan Architecture*, IEEE Std. 1149.1 (1990).

Certain problems arise in extending the debugging capabilities described above to include memory arrays. The additional logic required to connect all memory array elements into a single shift register is prohibitive both due to additional area usage and performance degradation. In addition, a self-timed memory array typically receives a single external clock, from which all other internal timing signals required for operation of the array are derived via delay circuits, logic gating, etc. A traditional implementation does not distinguish debug mode from normal operation mode, and as the state of the chip is being scanned in or out in the JTAG shift-DR state, the clock required for the shift operation will also trigger memory array operations, some of which, such as write or clear, may cause unplanned and undesired modification of the internal contents of the memory array. This would prevent the desired resumption of normal operation of the chip after the shift operation has concluded. Therefore, debugging capabilities for memory arrays are typically implemented by providing separate pins or ports through which the array elements or cells can be directly accessed. When debugging through separate pins, the state of the address, control and data registers do not necessarily correspond to the state of the data in the array because the data in the array were updated through the separate pins bypassing the address, control and data registers. Thus, the registers and the array are not in the same temporal state.

The present invention provides a method and apparatus to control the clock input and control signals to the memory array to prevent execution of a state-modifying memory operation in shift mode, while allowing all scannable state to be shifted without restriction. When all shift data is scanned into the component, the memory array operation, if any, dictated by the state of the scannable memory elements of the chip must then be executed, without affecting the state of any other memory elements, including other locations in the same memory array, other memory arrays, and all scannable memory elements, in order to prevent the progression in state of the address/control information of the memory array as well as other memory elements located on the chip during testing such that the state held in all memory elements throughout the chip will be at the same temporal state. Therefore the memory arrays can be debugged using the scan chain to read and write data to and from specified addresses in the memory array.

SUMMARY OF THE INVENTION

In the self-timed memory array of the present invention, a self-timed memory array comprising at least one memory cell is provided with full scan mode and debug capabilities. Each memory array has a plurality of control and address registers which are coupled to the respective control and address into the memory array. Data registers are coupled to the memory array via data lines to receive data read from the memory array and provide data to be written to the array. A timing generator circuit receives an external clock pulse and provides the self-timed clock pulses to the memory array. During the scan mode, the control, address and data registers are chained together such that data for testing can be scanned serially into the registers.

In order to prevent unplanned array modification operations from occurring during the scan mode because a bit shifted into the write-enable or clear control register at the time a primary clock pulse derived from the timing generator circuitry is generated, a logic means is provided to disable all memory operations during scan mode. A shift clock pulse is provided during scan mode to shift the test information into the control, address and data registers. Once all data has been scanned into the registers, the operation identified by the control and address data in the registers is performed without affecting the state of the control registers and without affecting the state of other memory cells and components on the chip. This is achieved by providing a separate clock pulse to the memory array to cause only the operation to be performed, but not to advance the state of the address and control registers. This clock pulse is generated by the JTAG controller after exiting the JTAG shift-DR state but before resumption of any other operation (normal or JTAG) to perform the test indicated by the data in the registers. Thus, the state of the address, control and data registers correspond to the state of data stored in the array such that the address, control and data registers are in the same temporal state.

Unlike prior art techniques, the entire state of the chip including memory arrays is scannable. Thus, through scan operations, the entire chip can be configured to reflect a certain state, wherein it is indistinguishable whether the state was reached through a scan or during normal operations.

BRIEF DESCRIPTION OF THE DRAWINGS

The objects, features and advantages of the present invention will be apparent to those skilled in the art in the following detailed description in which.

DETAILED DESCRIPTION OF THE INVENTION

In the following description for purposes of explanation, specific memories, organizations, device types, architectures, etc., are set forth in order to provide thorough understanding of the present invention. However, it will be apparent to one skilled in the art that the present invention may be practiced without these specific details. In other instances well known circuits are shown in block diagram form in order not to obscure the present invention unnecessarily. The following description describes a self-timed memory array. However, it will be obvious to one skilled in the art that the invention can be applied to the testing of other self-timed circuits and chips.

Figure 1:
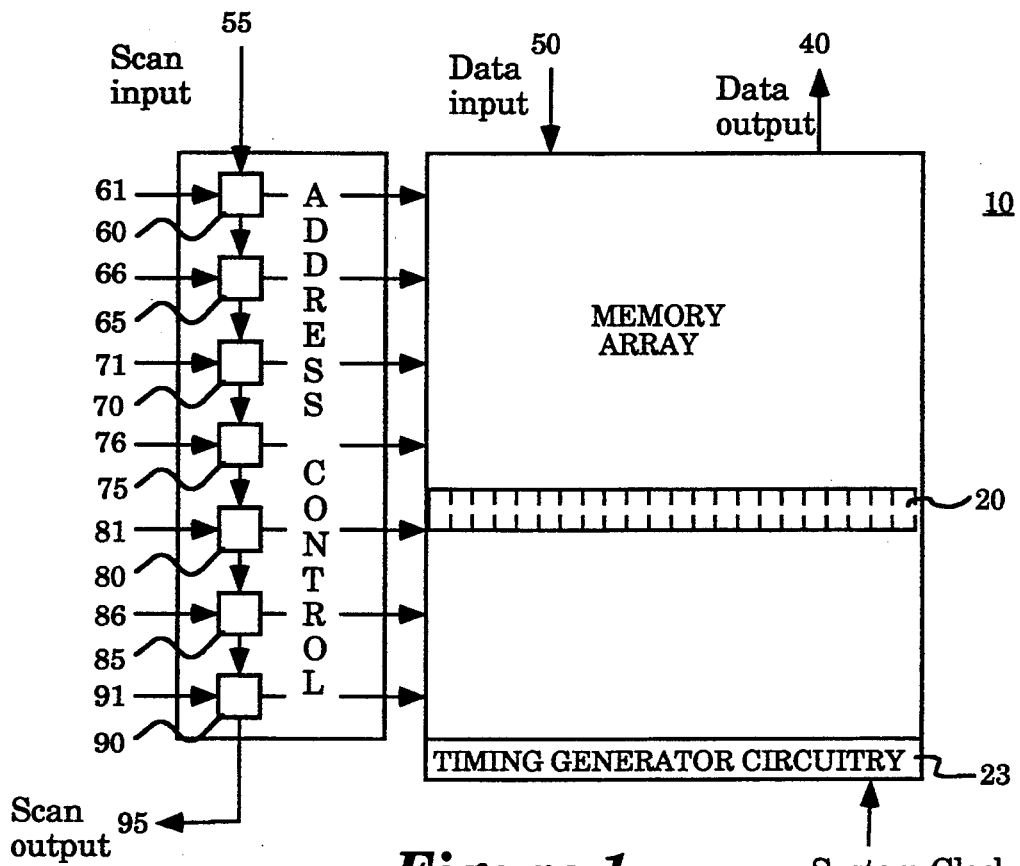
FIG. 1 illustrates a simplified block diagram of a self-timed memory array.

FIG. 1 shows a singular memory array 10 in accordance with the memory array of the present invention. Memory array 10 comprises groups (words) of memory elements or cells 20, control and address registers 30 and data input and data output lines 40 and 50 and timing generator circuitry 23. The timing generator circuitry 23 receives an external clock and generates the internal, self-timed clock pulses utilized by the array. The registers 30 are shown to be coupled or chained together such that data can be scanned into the array's control and address register through the scan input pin 55 and serially bit shifted through the individual registers 60, 65, 70, 75, 80, 85, 90, and appears at the array's scan output pin 95. The memory array registers have separate inputs 61, 66, 71, 76, 81, 86, 91, which are used to load address and control information in normal (non-shift) mode.

If the chip comprises a plurality of memory arrays, the registers are chained together such that the scan output 95 of a first array is coupled to the scan input 55 of the next sequential array such that data is serially shifted through the chained arrays.

Figure 2:
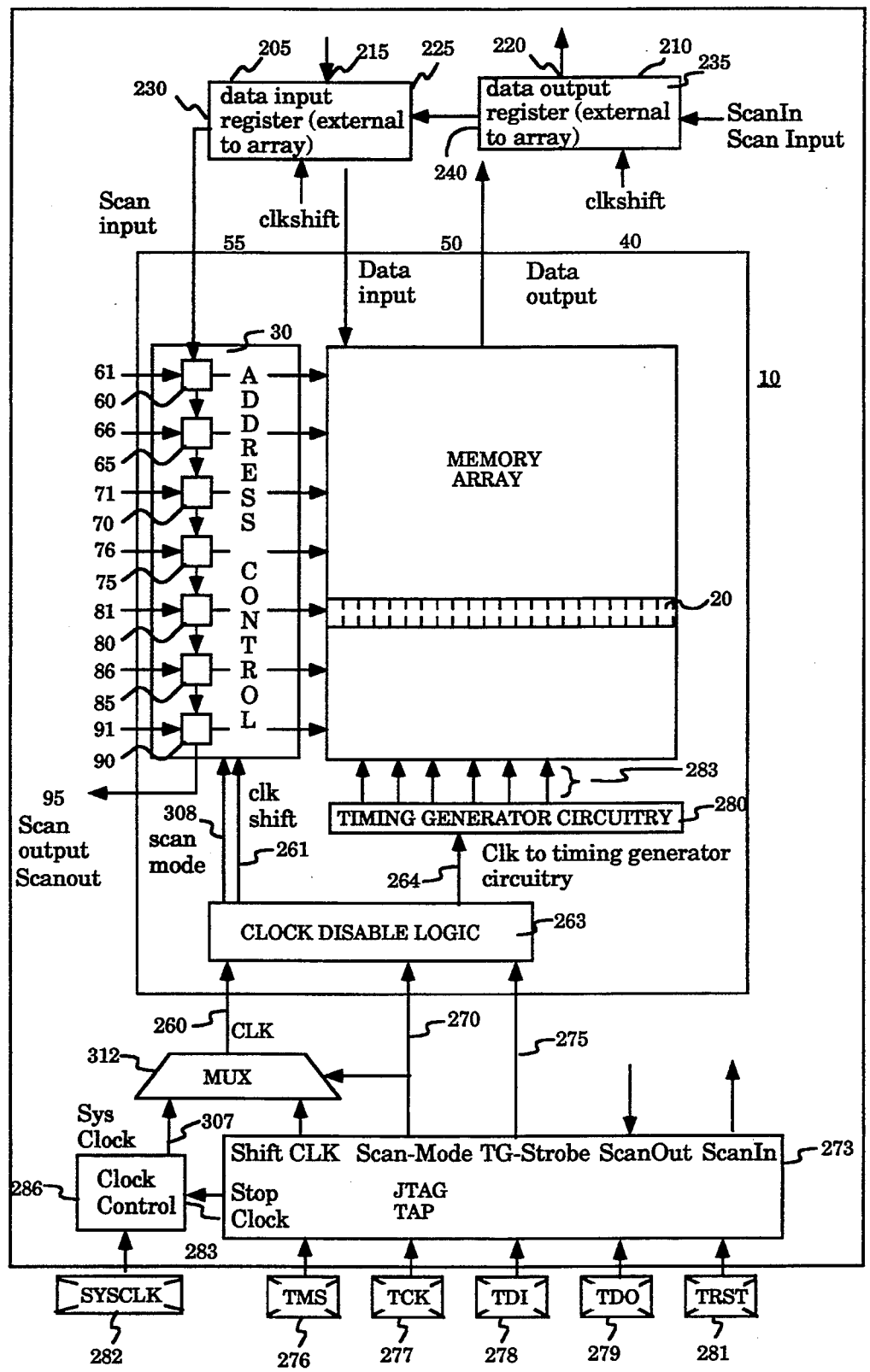
FIG. 2 illustrates the self-timed memory array of the present invention shown with external logic.

FIG. 2 provides more details as to the present invention. External to the memory array are input data register 205 and output data register 210. The external data input and data output registers 205, 210 have separate inputs and outputs 215, 220 used to load and read data in normal (non-shift) mode, as well as inputs and outputs 225, 230, 235, 240 to read data in and out during the scan mode. Thus, for example, the state scanned into the data input register is written to a selected location of the memory array if a write operation is scanned into the control registers contained in address and control registers 30 of the array.

The external registers 205, 210 are also part of the chip*s scan chain although they do not have to be connected directly to the array's scan input or output. Data is received through the scan data input pin of the chip 278 and during scan mode serially inputs data to scan data input, line 55, and address and control registers 60, 65, 70, 75, 80, 85, 90. One register, shown here as register 90, represents the write-enable bit. When this bit is set in normal operation (non-shift), and a clock pulse occurs, a write operation is performed based on the address contained in the address/control registers and the data at the data input 50. As bits are serially shifted during the scan process in order to load the proper data for a test, a self-timed clock pulse will occur during the scan mode at each shift clock and it is possible that the write-enable or clear control bit at that time contains data indicative that such an operation is to be performed. In order to prevent this erroneous writing or modification of data to the memory cell, a clock-disable means 263 is provided. A signal 270, identified as the scan mode signal, is issued to indicate that the scan mode is enabled, all scannable memory elements are to be formed into a shift register, and no memory array operations are to occur. Thus, the clock pulses to perform a memory operation which may occur are inhibited from reaching the timing generator circuitry 280.

Once the scanning in of data is complete and the scan mode signal is deasserted, a separate distinct clock pulse 275, referred to herein as $tg_{13}$ strobe, is asserted to the memory array's clock control mechanism (timing generator circuitry) 280 to indicate that the operation specified By the data contained in the registers 60–90 is to be performed. As the test clock pulse tg_strobe 275 is solely directed to the memory array's timing generator circuitry 280, the surrounding memory cells are not affected. This is important in order to maintain the proper temporal state with respect to the other memory cells and components located on the chip. Furthermore, the state of the memory array and its corresponding address, control and data registers are in the same temporal state as if in normal operation because a memory operation was performed with respect to the memory array through the memory array's address control and data registers, and not directly through separate pins used solely for debug purposes. As the temporal state is consistently maintained, once the operation is complete, normal operation of the chip may continue or a second scan mode may be entered to scan in or out data for the next operation to be performed.

The test access port (TAP) 273 interfaces with the memory array through a number of signals including scan_mode 270, tg_strobe 275, scan data input, scan data output and shift clock 306. In the system of the present invention the tap access port 273 interfaces with the clock disable means 263 to provide testing of the self-timed memory array 10. The tap access port 273, according to the JTAG standard, receives externally generated signals, TMS 276, TCK 277, TDI 278 and TRST 281 and output TDO 279. TAP 273 couples internally to provide TDI and TDO connections with the registers, for example, at points 235 and 95.

The system clock (SYSCLK) 282 which is normally input to the timing generator circuitry is instead input to the clock control circuit 286. The clock control circuit 286 also receives as input a stop clock signal 283 issued by the TAP circuit 273 during testing. This signal 283 causes clock control circuit 286 to temporarily halt issuance of the system clock to all elements on the chip including the memory component 10. The shift clock 306 and system clock 307 are input to multiplexor 312. The output clock signal 260 is the input clock signal to the self-timed memory array as well as other memory elements on the chip. The output of the multiplexor 312 is selected by the scan_mode signal 270 which is asserted when the TAP 273 is operating in scan mode. Thus, during normal operation, the system clock 307 is output and during scan mode the shift clock 306 is output from the multiplexor and input to the self-timed memory array 10.

The TAP circuit also outputs a signal, scan_mode 270, which indicates when the TAP circuit is scanning data into or out of the chip for testing. The address and control registers 30 receive the clk shift signal 261, and the scan_mode signal 308 (preferably from the clock disable logic 263) and shifts scan data serially through the registers.

As will be discussed subsequently, The clock disable logic 263 disables the clock signals in the self-timed memory array's timing generator circuitry in order to scan in the shift data without incurring a clock pulse that may cause an unplanned operation to be performed within the memory array. However, to perform the planned operation once the shift data is scanned in, a clock pulse needs to be asserted. The TAP circuit is therefore further configured to output a new signal, tg_strobe 275, which is asserted by the TAP circuit when the operation indicated by the state of the registers is to be performed.

The clock disable logic 263 located in the memory array, controls the issuance of clock signals in the memory cell. The clock disable logic 263 receives the tg_strobe and scan_mode signals from the TAP circuit 273 and the Clk signal 260 from the multiplexor 312.

Figure 3:
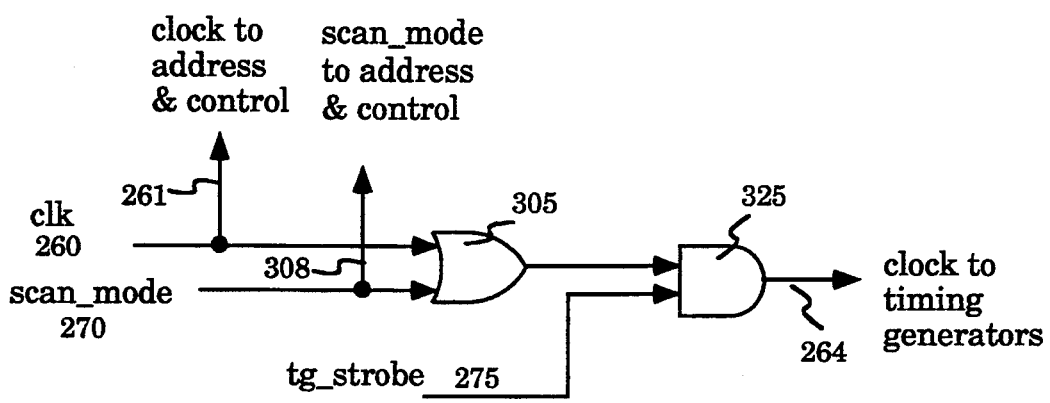
FIG. 3 is a block diagram of illustrative clock disable logic employed in the present invention.

FIG. 3 provides a conceptual block diagram of exemplary clock disable logic circuitry in the present invention. The memory chip's clock CLK 260, is input to an OR gate 305. The second input to the OR gate 305 is the scan_mode signal 270. Thus, when the scan mode is in effect the output of the OR gate will be in a constant on state irrespective of clock pulses on the CLK input. Similarly, by use of AND gate 325 having as inputs the output of OR gate 305 and the timing generator strobe 275, the timing generator circuitry 280 will receive a clock signal only during the issuance of the timing generator strobe 275.

Figure 4:
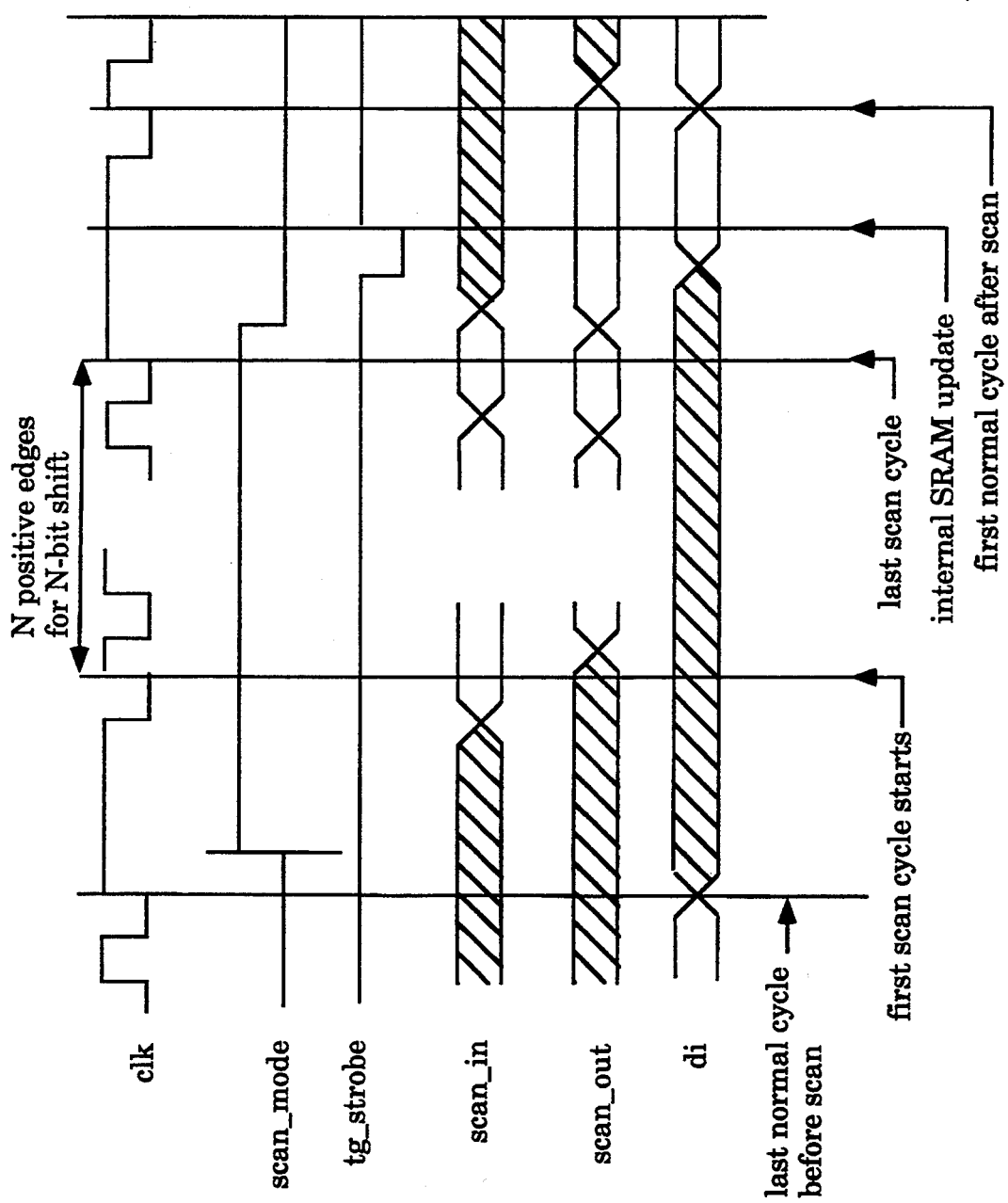
FIG. 4 provides illustrative timing diagrams showing the timing of the scan mode signal, the clock signal and the tg_strobe signal.

An illustrative timing diagram is shown in FIG. 4. The signal CLK is the main clock pulse to the memory array. The signal, scan_mode, when in the high state, indicates when the chip is in the scan mode. When the scan_mode signal reverts back to the low state, the scan mode is complete and the proper data has been loaded into the chip's scannable memory elements. Once the scan mode is complete, tg_strobe goes to a low state and subsequently returns to a high state to generate the rising edge which functions as the clock pulse to perform the operation of internal update pursuant to the data loaded during the scan mode. The data input signal, Di, when not shaded, indicates valid data input to the memory array.

While the invention has been described in conjunction with the preferred embodiment, it is evident that numerous alternatives, modifications, variations and uses will be apparent to those skilled in the art in light of the foregoing description.

What is claimed is:

1. A self-timed memory array comprising at least one memory cell, said memory array comprising control registers and control lines coupled to the control registers to control operations on the array of the memory cell, address registers and address lines coupled to the address registers to identify the address of the memory cell at which an operation is to be performed, data lines for supplying data to and reading data from the memory cell, and timing generator circuitry for receiving an external clock pulse from an external clock and providing self-timed clock inputs for performing operations on cells in the array, said memory array further comprising an apparatus for providing for testing of the array, said apparatus comprising:

shift means for chaining the control registers and address registers such that information can be serially shifted into and out of the control and address registers, said shift means being enabled during a shift mode;

means for disabling memory array operations while information is serially shifted into and out of the control and address registers;

a test clocking means for providing a test clock pulse to the memory array to be tested to cause an operation dictated by the information shifted into the control registers to be performed at the address identified in the address registers;

wherein a test operation is performed on a memory cell without affecting other memory cells of the array and maintaining a common temporal state with the address and control registers.

2. The memory array as set forth in claim 1, wherein said shift means for chaining further comprises means for coupling a last register of a first memory array to a first register of a second memory array such that data can be serially shifted in to the second memory array by shifting data through the control and address registers of the first memory array to the control and address registers of the second memory array.

3. The memory array as set forth in claim 1, further comprising a scan signal line which indicates when the memory array is in the shift mode.

4. The memory array as set forth in claim 1, wherein said means for disabling memory array operations disables the external clock to the timing generator circuitry during the shift mode.

5. The memory array as set forth in claim 1, wherein said test clocking means provides the test clock pulse after information has been serially shifted into the address and control registers.

6. The memory array as set forth in claim 1, further comprising a shift clock for providing shift clock pulses for the shift means to serially shift information into the address and control registers.

7. The memory array as set forth in claim 1, wherein said means for disabling memory operations enables the external clock to the timing generator's circuitry after the shift mode is finished and the test clock is asserted.

8. The memory array as set forth in claim 1, further comprising data registers coupled to the data lines for supplying data to and receiving data from the memory array.

9. The memory array as set forth in claim 8 wherein the memory array is coupled to a JTAG test access port (TAP) for receiving information external to the array to be serially shifted into and out of the address, control and data registers.

10. In a self-timed memory array comprising at least one memory cell, the memory array comprising control registers and control lines coupled to the control registers to control operations on the array of memory cells, address registers and address lines coupled to the address registers to identify the address of a memory cell at which an operation is to be performed, data lines for supplying data to and reading data from a memory cell, and timing generator circuitry for receiving an external clock pulse and for providing self-timed clock inputs for performing operations on memory cells in the memory array, a process for testing the memory array, comprising the steps of:

chaining the control registers and address registers such that information can be serially shifted into and out of the control and address registers during a shift mode;

shifting serially information into the control registers and address registers;

disabling memory array operations while data is serially shifted into and out of the control and address registers;

issuing a test clock pulse to the memory array to be tested once data is serially shifted into the registers to cause an operation dictated by the information shifted into the control registers be performed at the address identified in the address registers;

wherein a test operation is performed on a memory cell without affecting other memory cells of the array and maintaining a common temporal state with the address and control registers.

11. The process for testing the memory array as set forth in claim 10, further comprising the step of coupling a last register of a first memory array to a first register of a second memory array such that information can be serially scanned into the second memory array by shifting information through the registers of the first memory array to the registers of the second memory array.

12. The process for testing the memory array as set forth in claim 10, further comprising the step of issuing a shift mode signal, wherein said step of serially shifting information serially shifts information into the control registers and address registers while said shift mode signal is issued.

13. The process for testing the memory array as set forth in claim 10, wherein the step of disabling memory array operations comprises the step of disabling during the shift mode an external clock coupled to the array.

14. The process for testing the memory array as set forth in claim 10, further comprising the step of providing shift clock pulses to serially shift data into the address and control registers.

15. The process for testing the memory array as set forth in claim 10, further comprising the step of enabling the external clock after the shift mode is finished.

16. The process for testing the memory array as set forth in claim 10, wherein data registers are coupled to data lines for supplying data to and receiving data from the memory array, said step of chaining further comprises the steps of chaining the data registers to the control registers and address register such that information is serially shifted into and out of the registers, and said step of shifting serially shifts information into the control registers, address registers and data registers.

17. The process for testing the memory array as set forth in claim 16, further comprising the step of shifting information from the data registers after the test clock pulse is issued.

* * * * *